United States Patent [19]

Franssen et al.

[11] 4,321,552

[45] Mar. 23, 1982

[54] AMPLIFIER COMPRISING A FIRST AND A SECOND AMPLIFIER ELEMENT

[75] Inventors: Nico V. Franssen; Gerardus A. Van Maanen, both of Eindhoven; Henricus G. J. M. Kockelmans, Maastricht, all of Netherlands

[73] Assignee: U.S. Philips Corporation, New York, N.Y.

[21] Appl. No.: 167,262

[22] Filed: Jun. 2, 1980

Related U.S. Application Data

[63] Continuation of Ser. No. 960,530, Nov. 14, 1978, abandoned.

[30] Foreign Application Priority Data

Dec. 7, 1977 [NL]  Netherlands ................. 7313501

[51] Int. Cl.$^3$ .............................................. H03F 1/34
[52] U.S. Cl. .................................... 330/81; 330/84; 330/105; 330/151; 330/265; 330/293; 330/295
[58] Field of Search ............... 330/81, 84, 85, 105, 330/146, 149, 151, 258, 265, 271, 293, 295

[56] References Cited

U.S. PATENT DOCUMENTS 3,693,109  9/1972  Swerdlow ............................ 330/81

4,088,961  5/1978  Ashley ................................. 330/53

*Primary Examiner*—James B. Mullins
*Attorney, Agent, or Firm*—Thomas A. Briody; William J. Streeter; Edward W. Goodman

[57] ABSTRACT

An amplifier comprising a first and a second amplifier element, whose outputs are connected to a load, a difference circuit which comprises a comparator, in which the output signal of the first amplifier element is compated with the input signal thereof to produce a correction signal which is applied to second amplifier element, and a second substantially identical difference circuit which comprises a comparator in which the output signal of the second amplifier element is compared with the input signal thereof to produce a correction signal which is applied to the first amplifier element; a desired signal to be amplified being applied to both amplifier elements. The two amplifier elements, which may be preceded by preamplifiers, take the form of power amplifiers. Because the distortion signals appear at the load as "common mode" signals, the overall distortion becomes substantially zero in the case of equal attenuation in the two difference circuits. The power amplifiers may be provided with a voltage output as well as a current output.

15 Claims, 6 Drawing Figures

AMPLIFIER COMPRISING A FIRST AND A SECOND AMPLIFIER ELEMENT

This is a continuation, of application Ser. No. 960,530, filed Nov. 4, 1978 now abandoned.

The invention relates to an amplifier comprising a first and a second amplifier element, whose outputs are connected to a load, and a difference circuit comprising an attenuator, in which the outputs signal of the first amplifier element is compared with the input signal, after which a resulting correction signal is applied to the second amplifier element.

Such an amplifier is described in the book "Precision Electronics" by Klein and Zaalberg van Zelst, Centrex, Eindhoven, 1967, p. 164–165.

In this amplifier the two amplifier elements have a substantially equal gain factor and the second amplifier element functions as correction amplifier for the first amplifier element. For this purpose the output signal and the input signal are compared with each other in the auxiliary circuit in a comparator via an attenuator—whose attenuation is equal to the reciprocal of the gain factor of each amplifier element. The comparator provides the correction signal and using the known "add-what-is-missing" principle said correction signal is added to the output signal of the first amplifier element via the second amplifier. The output signals of the two amplifier elements are added, the relative error of the complete amplifier being equal to the product of the relative errors of the two amplifier elements.

An advantage of such an amplifier is that as a result of this the overall distortion is very small, while the system is stable.

The invention is based on the concept of not only having the one amplifier element act as correction element for the other element, but employing each of the two amplifier elements as compensator for the other element. Although the entire amplifier combination then contains a number of feedback loops, it is still possible to obtain a stable amplifier in this way.

The invention is characterized in that the two amplifier elements, as the case may be, preceded by preamplifiers, take the form of power amplifiers, and the second amplifier element is also provided with a substantially identical difference circuit comprising an attenuator, which supplies a correction signal to the first amplifier element, a signal to be amplified being applied to both amplifier elements.

In comparison with the known amplifier system the following advantages are obtained with the amplifier in accordance with the invention:
the overall distortion percentage is reduced and may even be reduced to a practically not, or hardly, measurable value when high-quality differential amplifiers are used (in this respect it is a requirement that each of the amplifier elements always transfers a signal);
final power amplifiers with a high distortion percentage may be used as amplifier elements,
the total power to be delivered is divided between two amplifiers; as a result of this and also because of the symmetrical arrangement of the amplifier elements, the attenuators and, as the case may be, the comparators, the amplifier is highly suitable for realization as an integrated circuit,
although positive and negative feedback loops are introduced in the amplifier, it has been found that the amplifier is stable.

It is particularly favourable to provide each amplifier element with a preamplifier having an inverting and a non-inverting input.

In the amplifier in accordance with the invention the amplifier elements may be provided with a voltage output or current output.

In the version with voltage output (low amplifier output resistance) the outputs of the two amplifier elements are connected to a load in push-pull, in known manner, and the input signal to be amplified is applied to inputs of the preamplifiers with opposite polarity.

Application of the input signal in phase opposition serves to ensure that the sum of the power of the two amplifier elements is available across the load. In accordance with a preferred variant of the invention each difference circuit is provided with a comparator, in which the input signal is compared with the output signal of the final power stage situated after the preamplifier, and which comparator then supplies the correction signal for the other amplifier element.

It is particularly suitable to use a differential amplifier with an inverting and a non-inverting input as the comparator. For such a use there are two possibilities of connecting the comparator, which results in two embodiments.

In one embodiment, the outputs of the final power stages are connected to the comparator inputs of the same polarity and the correction signals are applied to the preamplifier inputs of corresponding polarity.

In the other embodiment, the inputs of the final power stages are connected to the comparator inputs of opposite polarity, and each preamplifier input to which a correction signal is applied has the same polarity as each comparator input to which the output signal of the corresponding final power stage is applied.

In another suitable performing push-pull amplifier in accordance with the invention the final power stage, which is situated after the preamplifier in each amplifier element, has a voltage gain of substantially unity and is provided with an inverting input, the inverting input and output of the final power stage in each difference circuit being connected to each other via suitable substantially identical resistors, while the correction signal obtained in this junction point is applied to the inverting input of the non-corresponding preamplifier via an attenuator.

In the embodiment with current input (high amplifier-output resistance) the outputs of the two amplifier elements, which are connected in parallel with each other, are connected to ground via the load in known manner, and the input signal to be amplified is applied to the amplifier-element inputs of the same phase.

This embodiment is characterized in that in each difference circuit a measuring resistor is included between the output of the corresponding amplifier element and the load, the voltage before and after the measuring resistor being compared with each other in a difference amplifier, the resulting amplifier signal being compared with the input signal of the corresponding final power stage, after which the correction signal is obtained which is applied to the non-corresponding preamplifier in phase opposition to the input signal of the amplifier.

Each attenuator may consist of a simple potentiometer. In the last-mentioned embodiment this potentiometer is then included between the voltage-carrying output terminal of each amplifier element and earth. As previously stated, the resistance of this potentiometer is substantially higher than that of the load.

The differential amplifiers used in the amplifier arrangement preferably consist of linear operational amplifiers, which may also be used for the preamplifiers. These amplifiers may be regarded as virtually ideal because their distortion percentage is substantially negligible.

For a correct operation of the amplifier in accordance with the invention it is of great importance that the distortion percentage of the operational amplifiers is substantially smaller than that of the final power stages.

It has been stated previously that the amplifier in accordance with the invention is highly suitable for realization as an integrated circuit owing to the symmetrical arrangement of the amplifier elements etc.

This becomes even better when the said linear operational amplifiers are used.

If the attenuators in the auxiliary circuits have a substantially identical attenuation, the overall distortion percentage is substantially negligible, which is independent of the value of the distortion percentages of each final power stage.

Furthermore, it is desirable that the amplifier elements have substantially equal gain factors. This is in view of realization in integrated form.

For reasons of stability it is furthermore desirable that the attenuation in the two attenuators $\delta$ is smaller than $2/\alpha$, $\alpha$ being the gain factor of each individual amplifier element, as the case may be with the inclusion of the preamplifier.

The invention will now be described in more detail by means of embodiments shown in the Figures.

FIGS. 1 and 2 give a circuit diagram of an amplifier in accordance with the invention, the amplifier elements in FIG. 1 having a voltage output and those in FIG. 2 a current output.

Figure 1:
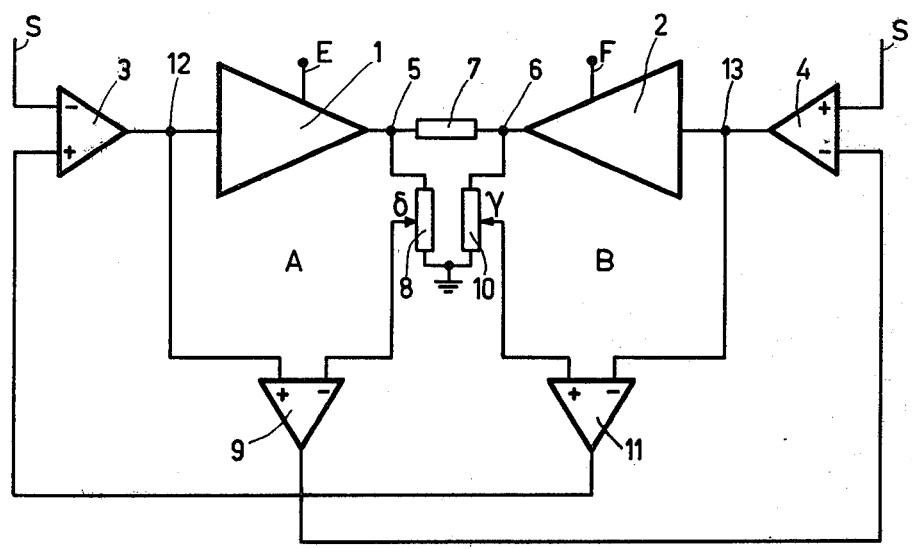

FIG. 1 represents the basic circuit arrangement of the amplifier in accordance with the invention. This amplifier comprises two amplifier elements 1 and 2, which are preceded by preamplifiers 3 and 4.

The amplifier elements 1 and 2 may be considered as final power stages, which may operate in class A or class B and even in class D in conjunction with a low-pass filter.

A load 7, which load may for example be a loudspeaker, has been included directly between the outputs 5 and 6 of the two respective amplifier elements 1 and 2.

The preamplifiers 3 and 4 take the form of differential amplifiers and have a non-inverting input (denoted by a + sign) and an inverting input (denoted by a − sign).

Preamplifier 3 receives the input signal s at the inverting input; preamplifier 4 receives this signal at the non-inverting input.

Each amplifier element is provided with a difference circuit, which essentially consists of an attenuator and a comparator.

Amplifier element 1 has an associated difference circuit A.

In this difference circuit, a part of the output voltage, available at the output terminal 5 of the first amplifier element 1, is applied, via the first attenuator, which takes the form of a potentiometer 8, to the inverting input of the first comparator 9, which takes the form of a differential amplifier. The output of the comparator 9 is connected to the inverting input of preamplifier 4. In a similar way the output terminal 6 of the second amplifier element 2 is connected, in difference circuit B, to the non-inverting input of the second comparator 11 via a second attenuator which takes the form a potentiometer 10; the output signal of said comparator being applied to the non-inverting input of the preamplifier 3 as a correction signal. The ends of the potentiometers 8 and 10, opposite from the respective outputs 5 and 6, are both connected to ground. The input terminal 12 of the first amplifier element 1 is furthermore connected to the non-inverting input of the first comparator 9, while the input terminal 13 of the second amplifier element 2 is connected to the inverting input of the second comparator 11.

The preamplifiers 3 and 4 and the comparators, 9 and 11 are linear operational amplifiers, whose voltage gain may be unity.

The operation of the push-pull output amplifier is as follows. The input signal s to be amplified, together with an applied correction signal, the input signal s being subtracted from the correction signal in preamplifier 3, is applied to the input 12 of the first amplifier element 1.

In the amplifier element 1, the previously combined signal is amplified by a gain factor $\alpha$. In the amplifier element 1, an error signal E is added to the amplified signal, which signal E represents the linear and the non-linear distortion of amplifier element 1.

Via a first attenuator 8 with an attenuation $\delta$, a part of the total output signal at the output 5 is compared with the applied signal in a comparator 9, which applied signal is obtained from input terminal 12.

In this respect, "attenuation" is to be understood to mean the voltage on the tapping of potentiometer 8 divided by the total voltage across said potentiometer.

The correction siganl from comparator 9 is combined with the input signal s in the preamplifier 4 in phase opposition. After the subtraction operation in preamplifier 4, the input signal at point 13 is amplified in amplifier element 2 by a gain factor $\beta$. The amplifier 2 has a certain distortion percentage, which, in the present example, is added to the amplified output signal as an error signal F.

A part of this output signal is then taken from output terminal 6 via an attenuator 10 with an attenuation $\gamma$ and is compared with the applied signal at 13 of amplifier element 2 in the second comparator 11, after which the correction signal therefrom is fed back to amplifier element 1 via preamplifier 3.

Ultimately, the following voltage is obtained across the load 7, i.e. between the output terminals 5 and 6:

$$\frac{2\alpha + 2\beta - \alpha\beta\gamma - \alpha\beta\delta}{\alpha\delta + \beta\delta - \alpha\beta\gamma\delta} \cdot S - \frac{E\beta(\gamma - \delta) - E\alpha(\delta - \gamma)}{\alpha\delta + \beta\gamma - \alpha\beta\gamma\delta}$$

in which the first term represents the undistorted signal and the second term the distortion.

It is evident that the last term is eliminated if $$E\beta(\gamma-\delta)=F\alpha(\delta-\gamma)$$

This requirement is met when $$\gamma = \delta$$

i.e. when the attenuations of the first and second attenuator are equal to each other; in that case the overall gain will be: $2/\gamma$.

However, the above-mentioned result can be obtained only if:

the distortion percentage of the linear operational amplifiers are substantially smaller, for example tens of dB's, than that of each amplifier element, i.e. of each final power stage;

the resistance of the load is several times smaller than that of the attenuators, i.e. the total resistance of the potentiometers (8 and 10);

the final power stages can always transfer a signal;

the so-called "slew rate", i.e. the pulse response time of all amplifier elements and the linear operational amplifiers, is smaller than or equal to the maximum "slew rate" of the input signal; and The attenuation $\delta$ is smaller than $2/\alpha$. These are the limiting conditions for obtaining a correct stability.

It is to be noted that of the comparators in FIG. 1, one comparator, for example 9, may be connected the other way around. If the output signal taken from terminal 5 via attenuator 8 is applied to the + input of comparator 9, i.e. the non-inverting input, and the input signal, taken from terminal 12, is applied to the − input, i.e. the inverting input, the correction signal from comparator 9 should then be applied to the + input of preamplifier 4.

Figure 2:
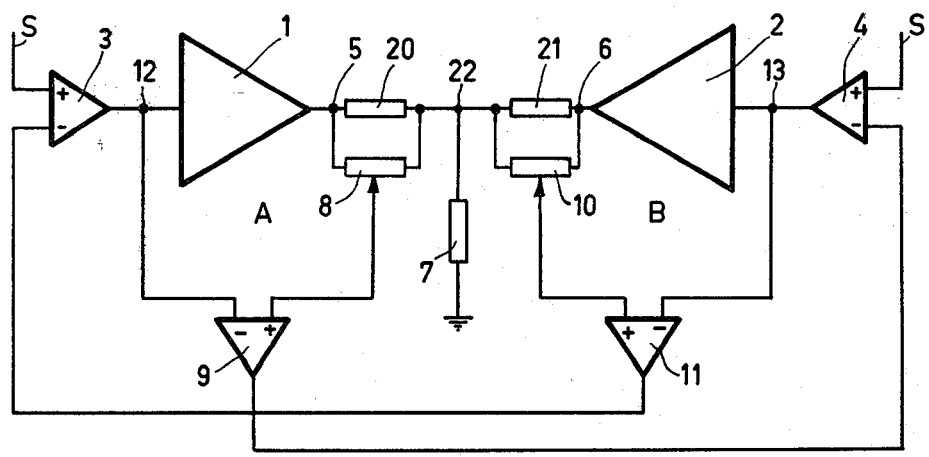

Instead of an amplifier with a voltage output, the amplifier elements 1 and 2 may also operate to provide a current output (see FIG. 2). For this purpose the output terminals 5 and 6 are connected to the common output terminal 22 via resistors 20 and 21, the load 7 being included between terminal 22 and ground.

The difference circuits A and B, with the comparators 9 and 11 and the attenuators 8 and 10, respectively, and their connections to the amplifier elements 1 and 2 and the preamplifiers 3 and 4, are similar to those in FIG. 1, noting that attention should be paid to the correct inputs of said elements.

In this amplifier circuit the resistors 20 and 21 function as measuring resistors. The voltages across these measuring resistors are attenuated to the proper values in the attenuators 8 and 10, respectively, and are applied to the comparators 9 and 11, respectively, in phase opposition to the input signals of amplifier elements 1 and 2 respectively, which are derived from input terminals 12 and 13 respectively.

The measuring resistors 20 and 21 have values which are several times smaller than that of the load 7.

Figure 3:
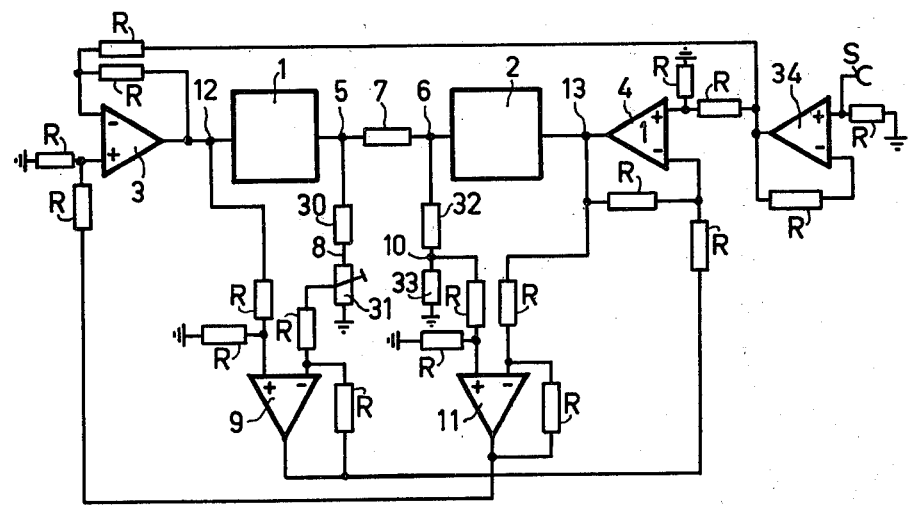
FIGS. 3 and 4 show elaborated variants of the amplifier in accordance with FIG. 1.

FIG. 3 shows another embodiment of the invention, which is essentially a variant of the push-pull amplifier in accordance with FIG. 1.

The attenuators 8 and 10 consist of potentiometers, which are adjusted to an attenuation which is substantially equal to the reciprocal of the gain factors $\alpha$ and $\beta$, i.e. $\gamma = \delta = 1/\alpha = 1/\beta$.

Potentiometer 8 consists of a fixed resistor 30 and a variable resistor 31, whilst potentiometer 10 consists of the fixed resistors 32 and 33.

The resistors 30 and 32 and the resistors 31 and 33 respectively are substantially identical.

With variable resistor 31 the attenuations $\gamma$ and $\delta$ can be equalized.

The input signal s is applied to a linear operational amplifier 34, which amplifier functions as impedance matching stage.

The preamplifiers 3 and 4, the comparators 9 and 11 and amplifier 34 are linear operational amplifiers whose gain factor is unity.

The resistors, which are designated R, each have a value which is equal to $2200\Omega$. The values of the resistors 30 and 32 are $7500\Omega$, while that of resistors 31 and 3 are $100\Omega$ and $90\Omega$ respectively.

This amplifier arrangement employs final power amplifiers as the amplifier elements 1 and 2, which can deliver 100 Watts into a 2-Ohm load at an input voltage of 200 mV, i.e. with a gain factor of approximately 70. These power amplifiers may be of the class B type SQ 4 (Philips).

The linear operational amplifiers which are used are of the type TDA 1034 (Philips), which may be regarded as ideal for frequencies up to 20 kHz.

As load 7 a loudspeaker is used, having an impedance of 4 ohms. As the amplifier elements are included in a bridge circuit, a power of 200 Watts is available.

With this push-pull output amplifier the following measuring results of two types of distortion—harmonic and intermodulation distortion—have been obtained. The values have been measured with the aid of a spectrum analyzer HP 3580 A. During the intermodulation measurement two signals of the same amplitude but different frequency are applied to the amplifier to be tested. The measuring results have been obtained at full drive of the power output stages:

| f | harmonic distortion | |
|---|---|---|
| | $d_{tot.\ non\text{-}comp.}$ | $d_{tot.\ comp.}$ |
| 1 kHz | 0.33% | '0' |
| 10 kHz | 0.43% | 0.03% |

| intermodulation distortion | |
|---|---|
| first frequency $f_1$ = 14 kHz; second frequency $f_2$ = 15 kHz. | |
| $d_{tot.\ non\ comp}$ | $d_{tot.\ comp.}$ |
| 0.5% | 0.02% |

("$d_{tot}$ comp." is the relevant distortion obtained with the circuit of FIG. 3 and "$d_{tot}$.noncomp." is the corresponding relevant distortion with the feedback loops, including the comparators 9 and 11, open).

From these values it follows that these distortions are substantially reduced by compensation, i.e. by the use of the difference circuit with associated attenuators and compensators.

Figure 4:
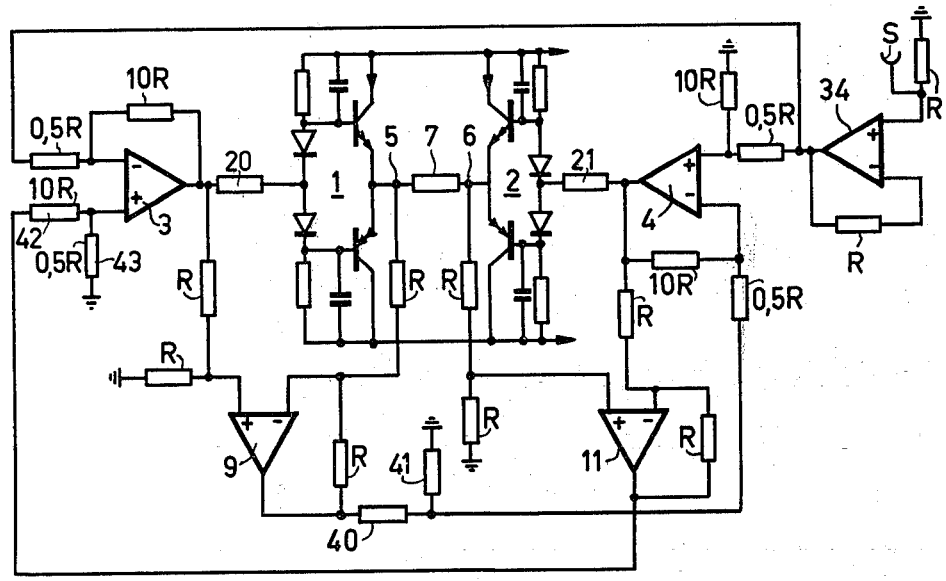

FIG. 4 shows a different variant of the amplifier in accordance with FIG. 3.

In this case the amplifier elements 1 and 2 consist of two class-B output stages with npn and pnp Darlington power transistors of the silicon type, whose voltage gain factors are 0.9. Integrated linear operational amplifiers of the TDA 1034 type are used as the preamplifiers 3 and 4 and the comparators 9 and 11.

In this case, the preamplifiers function as voltage amplifiers with a gain factor of 19.2, while at the same time, they serve as the driver circuits for the Darlington output stages. The correction signals from the comparators 9 and 11 are attenuated to 0.05 of their value by the potentiometer resistors 40 and 41 and by 42 and 43, respectively.

The current through the diodes in the output stage (approximately 10 mA) is always sufficiently large to ensure a satisfactory drive of the output stages; the quiescent current $I_r$ through the output transistors is approximately 3.3 mA, which means that the output transistors always remain operative even during the zero passages, i.e. that the output stages continue to carry a signal, which also follows from the measuring results below:

| | harmonic distortion in % | | | | | |
|---|---|---|---|---|---|---|
| | d tot. non-comp. $I_r$ = 3.3 mA | | d tot. comp. $I_r$ = 0 | | d tot. comp. $I_r$ = 3.3 mA | |
| fkHz | | | | | | |
| $V_u$ | 0.3 | 15 | 0.3 | 15 | 0.3 | 15 |
| 1 | 24 | 1.6 | 12 | 0.25 | 0.5 | '0' |
| 10 | 25 | 1.8 | 6 | 0.15 | 1.0 | 0.05 |

In these results $d_{tot\text{-}comp.}$ and $d_{tot\text{-}noncomp.}$ have the same meanings as given previously, but for the circuit of FIG. 4. The distortion figures are each time given at a low and a high effective voltage $V_u$ in volts across the load $R = 6\Omega$.

At the low voltage $V_u = 0.3$ V the Darlington output transistors are substantially turned off, the specified distortion figures are then very high, although the effect of the compensation is very well noticeable. However, at a specific quiescent current the distortion figures are substantially reduced.

| intermodulation distortion in % at $I_r$ = 3.3 mA comp. | | |
|---|---|---|
| $f_1$ = 14 kHz | $V_u$ = 7.5 $V_{r.m.s.}$ | $V_u$ = 1 $V_{r.m.s.}$ |
| $f_2$ = 15 kHz | 0.28 | 0.18 |
| $f_1$ = 60 khz | '0' | 0.45 |
| $f_2$ = 8 kHz | | |

The resistors included in this amplified are specified in fractions of R, where necessary.

The value of R is 2200Ω. The value of the attenuator resistor 41 is 135Ω.

Figure 5:
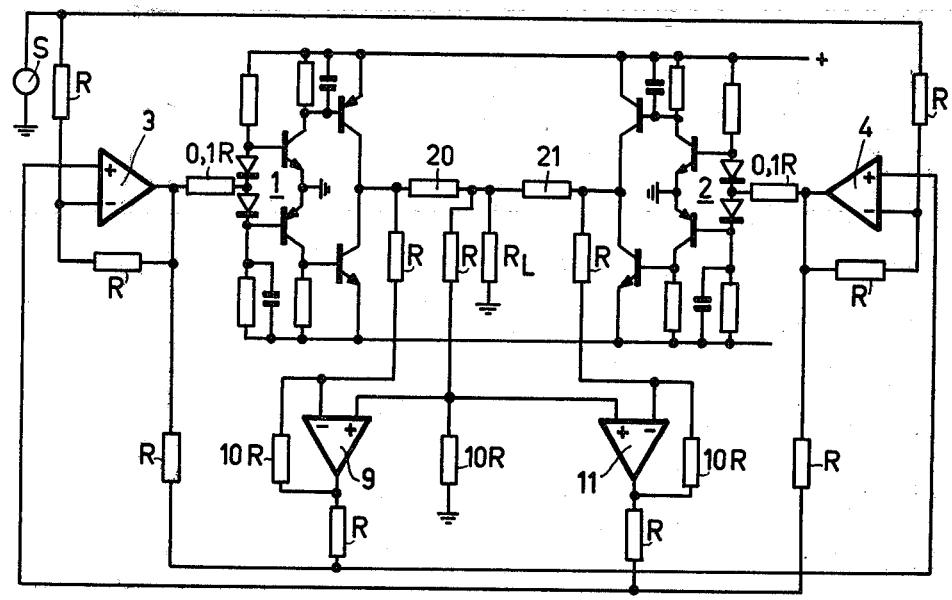
FIG. 5 shows a variant of the amplifier in accordance with FIG. 2.

FIG. 5 shows an amplifier in accordance with the invention, which is essentially a variant of the amplifier of FIG. 2, but in which the amplifier elements comprise the same Darlington transistors as those in the amplifier of FIG. 4.

The measuring resistors 20 and 21 have a value of 0.1Ω. The principal resistors in the amplifier are specified in factors of R, while R = 2200Ω. In the comparators 9 and 11 the gain is 10.

The overall attenuation is determined by the values of the measuring resistors 20 and 21, respectively, and by the gain of the associated comparators 9 and 11, respectively.

Figure 6:
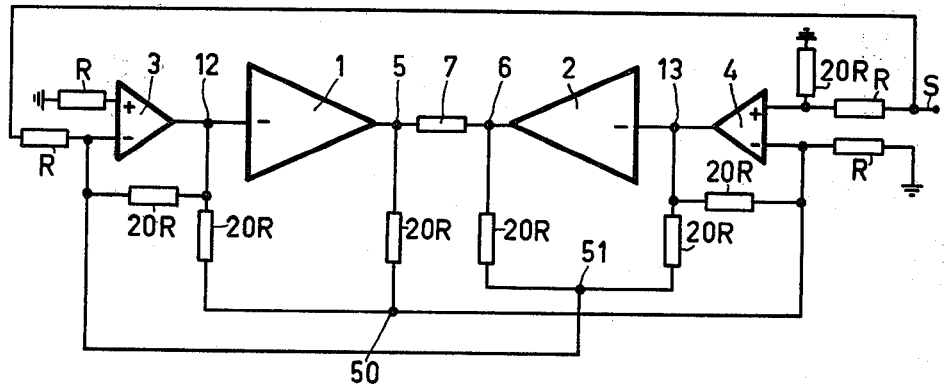
FIG. 6 is a simple variant of the amplifier in accordance with FIG. 1.

FIG. 6 shows a simple variant of an amplifier in accordance with the invention.

The amplifier elements 1 and 2 are provided with an inverting input.

From the final power stage 1 the incoming signal at input 12 is added in phase opposition to the output signal 5 via equal resistors 20R at junction point 50, after which the difference signal is applied to the inverting input of preamplifier 4 with an attenuation of 20:1. These resistors 20R thus constitute the difference circuit mentioned hereinbefore.

In the second auxiliary circuit, the difference signal is obtained in a similar way at junction point 51 and is applied to the inverting input of preamplifier 3 with the same attention.

In an experimental version of this amplifier the same operational amplifiers and final power stages are used as in the amplifier in accordance with FIG. 4.

It has been found that during all distortion measurements and at any available output power the distortion components in the output signal are smaller than −70 dB.

What is claimed is:

1. An amplifier comprising a first and a second amplifier element; a load; said first and said second amplifier elements each having the output thereof connected to the load; a first and a second preamplifier coupled respectively to the inputs of said first and said second amplifier elements; a first and a second difference circuits having inputs coupled respectively to said first and said second amplifier elements and outputs coupled respectively to said second and said first preamplifiers; said difference circuits each comprising an attenuator and a comparator, wherein said attenuator is coupled to the output of the corresponding amplifier element and said comparator is coupled both to said attenuator and to the input of said corresponding amplifier element for continuously comparing the input signal of said corresponding amplifier element with the attenuated output signal thereby producing a correction signal, which correction signal is applied to the input of the preamplifier coupled to said other amplifier element; whereby when a signal to be amplified is applied simultaneously to both of said preamplifiers, this signal is respectively combined with said correction signals in said preamplifiers and the resultant combined signals thereby become the respective input signals to said amplifier elements.

2. An amplifier as claimed in claim 1, wherein each difference circuit comprises two resistors, to which the input and the output signal of the corresponding amplifier element are applied in phase opposition and at whose junction point the correction signal is available.

3. An amplifier as claimed in claim 2, the outputs of the two amplifier elements being connected to a load in push-pull and the input signal to be amplified being applied to preamplifier inputs of opposite polarity, and wherein each amplifier element has a gain of substantially unity and is provided with an inverting input, while in each difference circuit the resistors are of substantially equal value, the correction signal obtained on the junction point thereof being coupled to the inverting input of the non-corresponding preamplifier.

4. An amplifier as claimed in claim 1, wherein each of said preamplifiers includes an inverting and a non-inverting input while the input signal to be amplified is applied to inputs of the preamplifiers with opposite polarity, and the outputs of said amplifier elements are connected to said load in a push-pull relation.

5. An amplifier as claimed in claim 4 wherein each of said comparators comprises a differential amplifier with an inverting and a non-inverting input.

6. An amplifier as claimed in claim 5, wherein the outputs of said amplifier elements are coupled to the comparator inputs of opposite polarity and each input of said preamplifiers, to which said correction signals are applied, has the same polarity as each input of the comparator to which the output signal of said corresponding amplifier element is applied.

7. An amplifier as claimed in claim 1, wherein the outputs of the two amplifier elements are connected in parallel one with the other and are connected to ground via the load, the input signals to be amplified being applied to amplifier element inputs of the same phase, and wherein each difference circuit further comprises a measuring resistor between the output of the corresponding amplifier element and the load and, in turn, is coupled to said attenuator, whereby the voltages before and after the measuring resistor is attenuated by said attenuator and is applied, along with the input of said corresponding amplifier element, to said comparator.

8. An amplifier as claimed in claim 7, wherein each comparator comprises a differential amplifier with an inverting and a non-inverting input.

9. An amplifier as claimed in claim 8, wherein the outputs of said amplifier elements are coupled to the corresponding comparator inputs of equal polarity and the correction signals therefrom are applied to the pre-amplifier inputs of equal polarity.

10. An amplifier as claimed in claim 8, wherein the differential amplifiers comprise linear operational amplifiers.

11. An amplifier as claimed in claim 10, wherein the distortion percentage of the operational amplifiers is substantially smaller than that of the final power stages.

12. An amplifier as claimed in claim 1 wherein each attenuator comprises a potentiometer.

13. An amplifier as claimed in claim 1 wherein the attenuators produce a substantially identical attenuation in both auxiliary circuits.

14. An amplifier as claimed in claim 13, wherein the amplifier elements have substantially equal gain factors.

15. An amplifier as claimed in claim 14 wherein the attenuation in the two attenuators is smaller than $2/\alpha$, $\alpha$ being the gain factor of each amplifier element.

* * * * *